(12) United States Patent
Chao et al.

(10) Patent No.: US 8,704,298 B1
(45) Date of Patent: Apr. 22, 2014

(54) MOS DIODE WITH TERMINATION STRUCTURE AND METHOD FOR MANUFACTURING THE SAME

(71) Applicant: PFC Device Corp., New Taipei (TW)

(72) Inventors: Kuo-Liang Chao, New Taipei (TW);
Mei-Ling Chen, New Taipei (TW);
Lung-Ching Kao, New Taipei (TW);
Hung-Hsin Kuo, New Taipei (TW)

(73) Assignee: PFC Device Corp., New Taipei (TW)

( * ) Notice: Subject to any disclaimer, the term of this patent is extended or adjusted under 35 U.S.C. 154(b) by 0 days.

(21) Appl. No.: 13/831,195

(22) Filed: Mar. 14, 2013

(30) Foreign Application Priority Data

Nov. 21, 2012 (TW) .............................. 101143404 A

(51) Int. Cl.
*H01L 29/76* (2006.01)
*H01L 21/336* (2006.01)

(52) U.S. Cl.
USPC ................... 257/333; 438/268; 257/E29.027; 257/E29.262

(58) Field of Classification Search
USPC ................. 438/242, 248, 259, 268, 391, 700; 257/288, 327–329, 341–345, 491–493, 257/496, E29.027, E29.262
See application file for complete search history.

(56) References Cited

U.S. PATENT DOCUMENTS

| 6,624,030 B2 | 9/2003 | Chang et al. |
| 7,557,409 B2 * | 7/2009 | Pattanayak et al. ........... 257/333 |

* cited by examiner

*Primary Examiner* — Matthew W Such
*Assistant Examiner* — Monica D Harrison
(74) *Attorney, Agent, or Firm* — Muncy, Geissler, Olds & Lowe, P.C.

(57) ABSTRACT

A MOS diode includes a substrate with a mesa, a P-type semiconductor region with etched shallow trench surrounding the mesa, that cause an increasing metal contact area to reduce Vf value, a gate oxide layer arranged on the mesa, a polysilicon layer arranged on the gate oxide layer, and a shielding oxide layer arranged on the polysilicon layer. The termination structure includes a trench, an oxide layer arranged at least within the trench, at least one sidewall polysilicon layer arranged on the oxide layer within the trench. In the MOS diode, the shielding oxide layer is thicker than the gate oxide layer to prevent leaking current. The oxide layer and the sidewall polysilicon layer can enhance the reverse voltage tolerance of the MOS diode. A metal layer covers the polysilicon region, shielding oxide layer, semiconductor regions with etched shallow trench, termination region and some parts outside the termination region.

16 Claims, 13 Drawing Sheets

MOS DIODE WITH TERMINATION STRUCTURE AND METHOD FOR MANUFACTURING THE SAME

BACKGROUND OF THE INVENTION

1. Field of the Invention

The present invention relates to a MOS diode with termination structure, especially to a MOS diode with termination structure to have lower leakage current and higher reverse voltage tolerance.

2. Description of Prior Art

A Schottky diode is a unipolar device using electrons as carriers, and it is characterized with high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

For combining the benefits of the Schottky diode and the P-N junction diode, a configuration of a gated diode device has been disclosed. In the gated diode, the equi-potential gate and source electrodes of a planar MOSFET are served as the anode, and the drain electrode at the backside of the wafer is served as the cathode. The gated diode device has comparable or lower forward voltage drop with respect to the Schottky diode. The reverse leakage current of the gated diode device is similar to that of the P-N junction diode, but is lower than that of the Schottky diode. The reverse recovery time at high temperature of the gated diode device is similar to that of the Schottky diode. The interface tolerance temperature of the gated diode device is higher than that of the Schottky diode. In practical applications, the gated diode device is advantageous over the Schottky diode.

A typical gated diode device has been disclosed in U.S. Pat. No. 6,624,030, which is entitled "RECTIFIER DEVICE HAVING A LATERALLY GRADED P-N JUNCTION FOR A CHANNEL REGION". Please refer to FIGS. 1A~1L, which schematically illustrate a method of manufacturing a gated diode device. Firstly, as shown in FIG. 1A, an N+ substrate 20 with an N-epitaxial layer 22 grown thereon is provided, wherein a field oxide layer 50 is grown on the surface of the N-epitaxial layer 22. Then, as shown in FIG. 1B, a photoresist layer 52 is formed on the field oxide layer 50. A first photolithography and etching process is performed to partially remove the field oxide layer 50. Then, a first ion-implanting process is performed to dope the substrate with a P-type dopant (e.g. boron) through openings in the photoresist layer 52. Then, a boron thermal drive-in process is performed to form edge P-doped structures 28 and a center P-doped structure 30 (FIG. 1C). Then, a second ion-implanting process is performed to dope the substrate with BF2. Then, a second photolithography and etching process is performed to use a photoresist layer 54 to cover the periphery of the device region and remove the field oxide layer 50 in the center of the device region (FIG. 1D and FIG. 1E). As shown in FIG. 1F, a gate silicon oxide layer 56, a polysilicon layer 58 and a silicon nitride layer 60 are sequentially grown, and an arsenic implantation process is made. Then, as shown in FIG. 1G, an oxide layer 62 is formed by chemical vapor deposition. Then, a third photolithography and etching process is performed to form a gate-pattern photoresist layer 64 over the oxide layer 62.

Afterward, a wet etching process is performed to etch the oxide layer 62 while leaving the oxide layer 62 under the gate-pattern photoresist layer 64 (FIG. 1H). Then, a dry etching process is performed to partially remove the silicon nitride layer 60, and a third ion-implanting process is performed to dope the substrate with boron ion (FIG. 1I). Then, the remaining photoresist layer 64 is removed, and a fourth ion-implanting process is performed to dope the substrate with boron ion to form a P-type pocket 36 (FIG. 1J). Then, a wet etching process is performed to remove the silicon oxide layer 62, and a dry etching process is performed to partially remove the polysilicon layer 58 (FIG. 1K). Then, an arsenic implantation process is made to form an N-doped source region 24, a wet etching process is performed to remove the silicon nitride layer 60, and an arsenic implantation process is made (FIG. 1L). Meanwhile, some fabricating steps of the gated diode device have been done. After subsequent steps (e.g. metal layer formation, photolithography and etching process, and so on) are carried out, the front-end process is completed.

In comparison with the Schottky diode, the gated diode device fabricated by the above method has comparable forward voltage drop, lower reverse leakage current, higher interface tolerance temperature, better reliability result and longer reverse recovery time (at the room temperature).

However, the above-mentioned gated diode device has lower response speed because the polysilicon layer 58 has larger parasitic capacitance. The Vf value of the gated diode device is also high for high voltage operation.

SUMMARY OF THE INVENTION

An object of the present invention is to provide MOS diode with termination structure, the termination structure uniformly spreading electric field to enhance the reverse voltage tolerance of the MOS diode.

Accordingly, the metal oxide semiconductor (MOS) diode with termination structure comprises a substrate having at least a first conductive-type epitaxial layer and a plurality of mesas formed on the first conductive-type epitaxial layer; a plurality of etched shallow trenches surrounding the mesas; a plurality of second conductive-type semiconductor regions arranged in the etched shallow trenches; a plurality of gate oxide layers arranged on corresponding mesas; a plurality of polysilicon layers arranged on corresponding gate oxide layers; a plurality of shielding oxide layers arranged on corresponding polysilicon layers and covering at least partial surface of the polysilicon layers, a thickness of the shielding oxide layers being thicker than a thickness of the gate oxide layer; a termination structure comprising: a trench formed on the first conductive-type epitaxial layer; an oxide layer arranged at least in the trench; a sidewall polysilicon layer arranged on the oxide layer within the trench; and a metal layer covering the second conductive-type semiconductor regions, the polysilicon layers, the shielding oxide layers, the oxide layer in the trench and the sidewall polysilicon layer in the trench.

The shielding oxide layer is thicker than the gate oxide layer to reduce parasitic capacitance. The provision of oxide layer and sidewall polysilicon layer within the trench can advantageously spread the surface electric field to enhance the reverse voltage tolerance of the MOS diode. The P-type semiconductor region has etched shallow trench surrounding the mesa, that cause an increasing metal contact area to reduce the Vf value.

Moreover, the present invention further discloses a method for manufacturing a metal oxide semiconductor (MOS) diode with termination structure comprising:

(a) providing a substrate having at least a first conductive-type epitaxial layer, the first conductive-type epitaxial layer having a trench, the MOS diode having a device region on one side of the trench and a termination region on another side of the trench, the trench having an oxide layer therein;

(b) forming a gate oxide layer, a polysilicon layer and a shielding oxide layer sequentially on the first conductive-type epitaxial layer;

(c) forming a plurality of mesas on the device region and forming etched shallow trenches surrounding the mesas, and forming sidewall polysilicon layer on the oxide layer within the trench;

(d) ion-implanting the etched shallow trenches to for plurality of second conductive-type semiconductor regions arranged in the etched shallow trenches; and (e) forming a metal layer on the device region and on the trench.

The shielding oxide layer arranged atop the gate oxide layer and the polysilicon layer can reduce parasitic capacitance. The provision of CVD oxide layer and sidewall polysilicon layer within the trench can advantageously spread the surface electric field to enhance the reverse voltage tolerance of the MOS diode. The P-type semiconductor region has etched shallow trench surrounding the mesa, that cause an increasing metal contact area to reduce the Vf value.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1A:
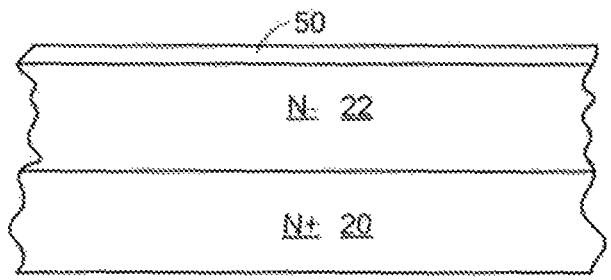
FIGS. 1A~1L schematically illustrate a method of manufacturing a gated diode device.
Figure 1B:
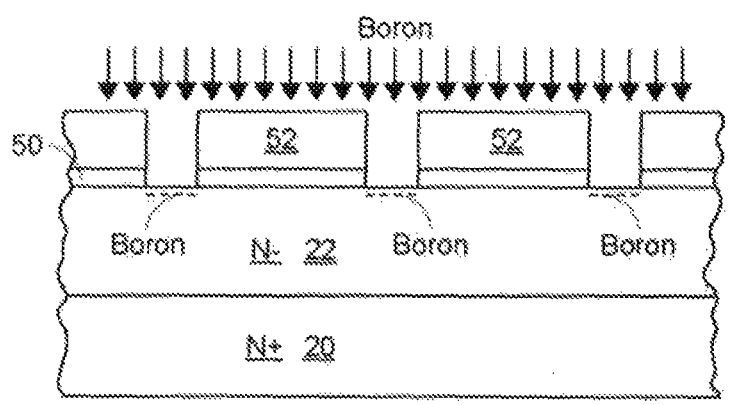
Figure 1C:
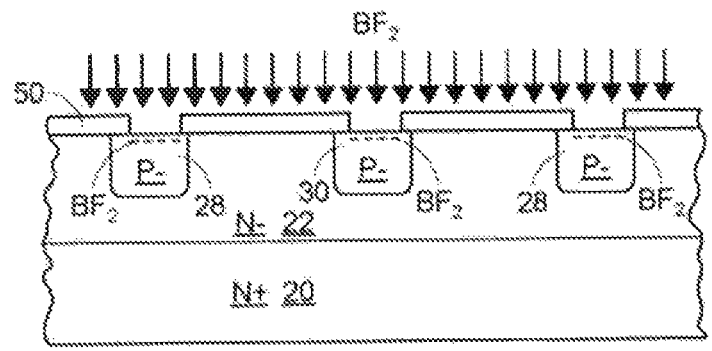
Figure 1D:
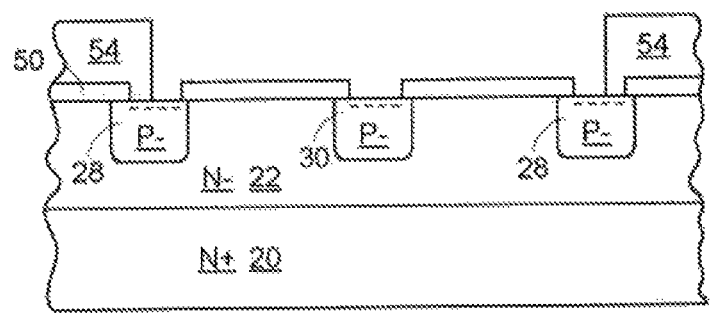
Figure 1E:
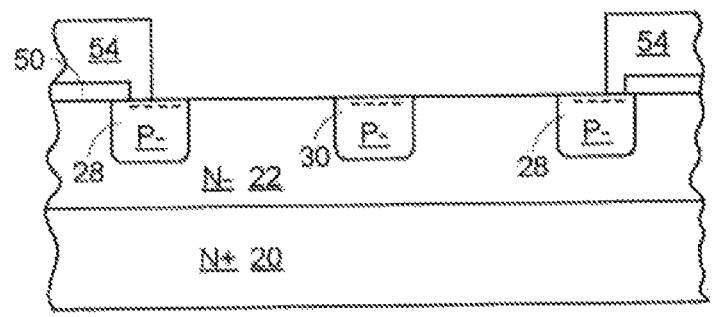
Figure 1F:
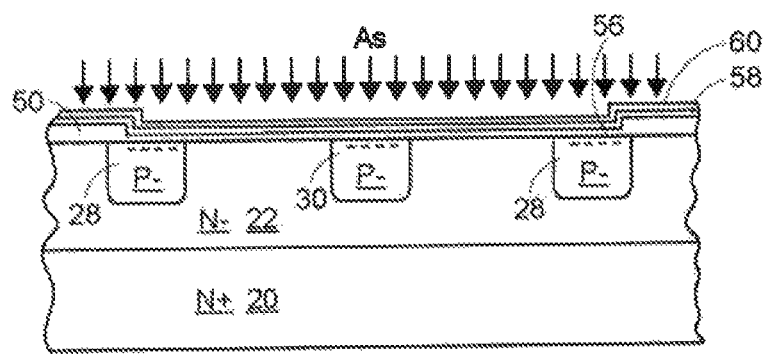
Figure 1G:
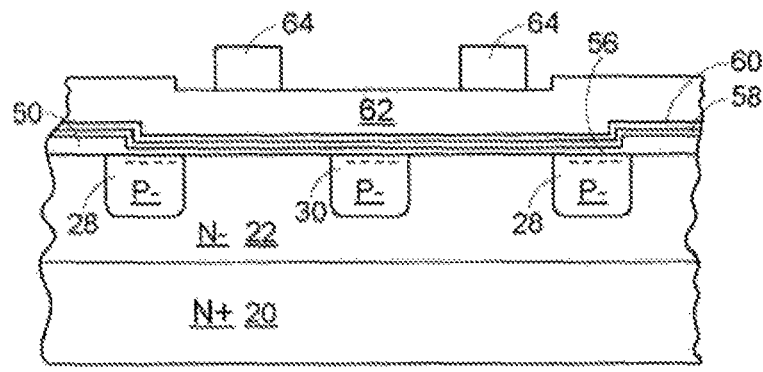
Figure 1H:
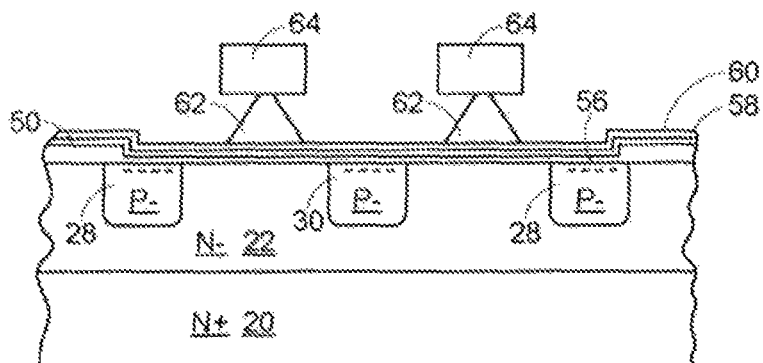
Figure 1I:
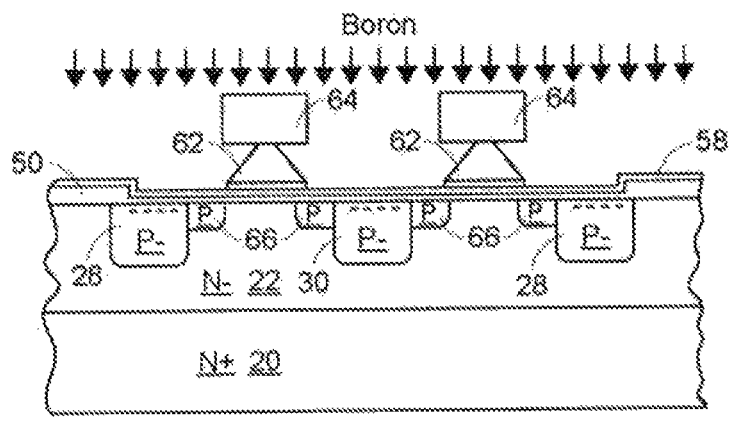
Figure 1J:
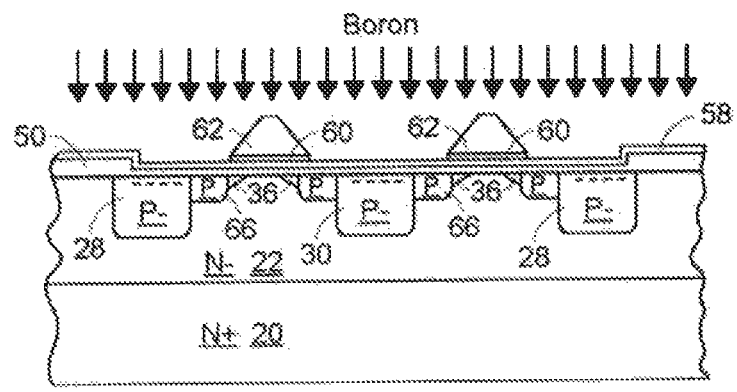
Figure 1K:
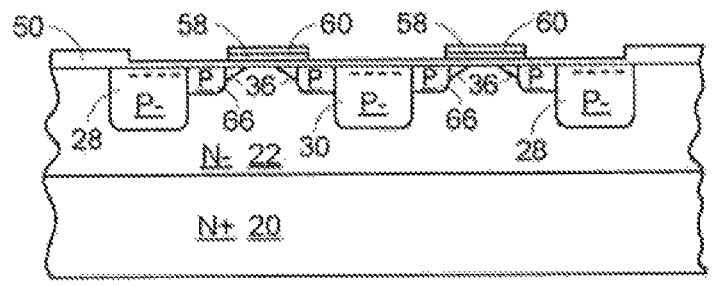
Figure 1L:
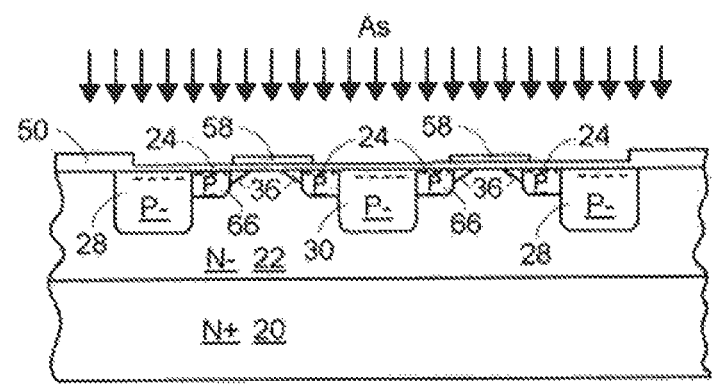
Figure 2A:
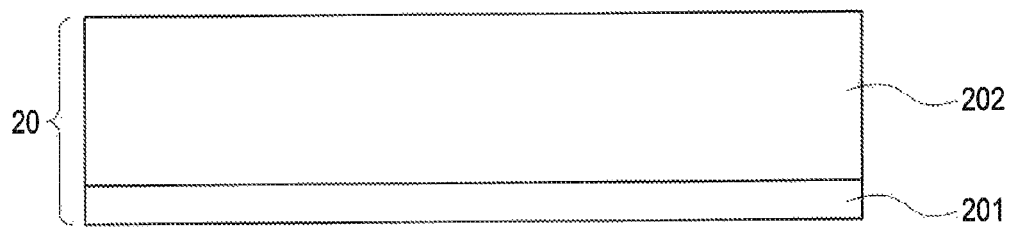
FIGS. 2A to 2S illustrate method of manufacturing a MOS diode with termination structure according to an embodiment of the present invention.
Figure 2B:
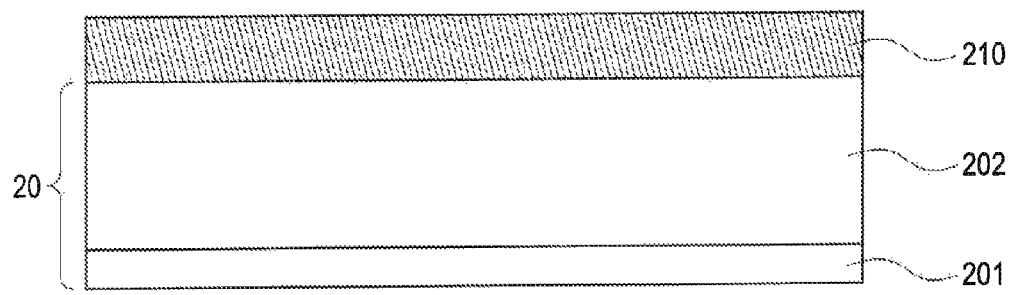
Figure 2C:
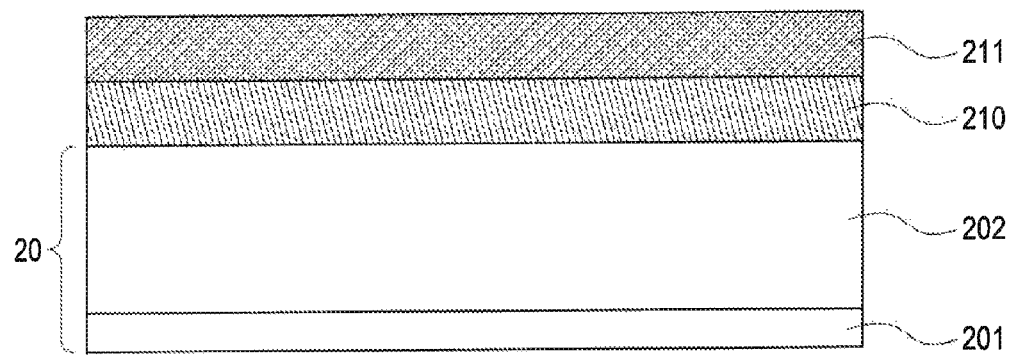
Figure 2D:
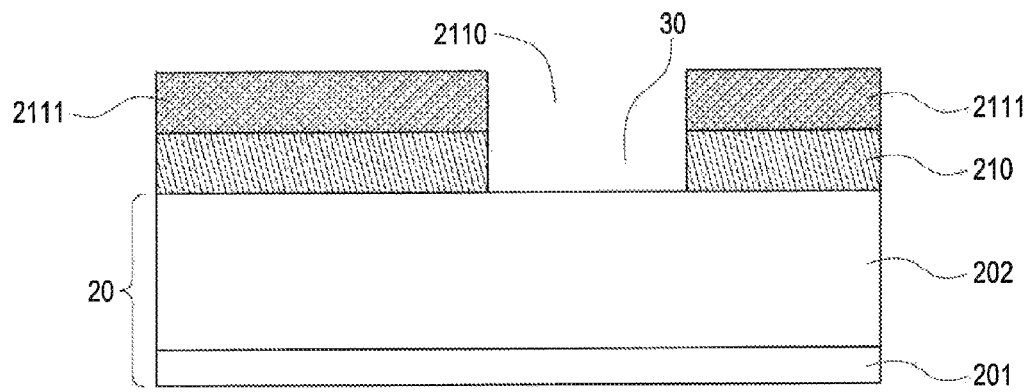
Figure 2E:
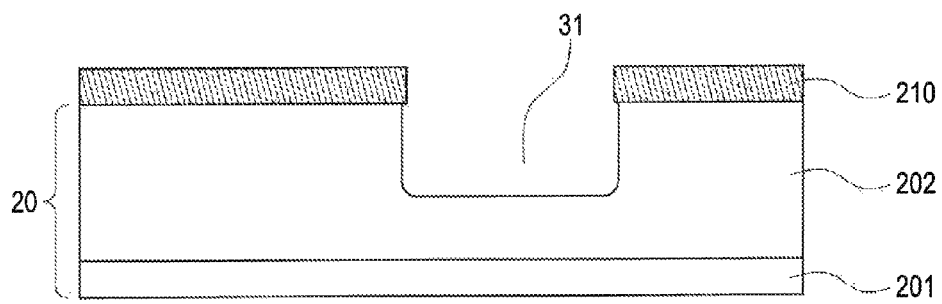
Figure 2F:
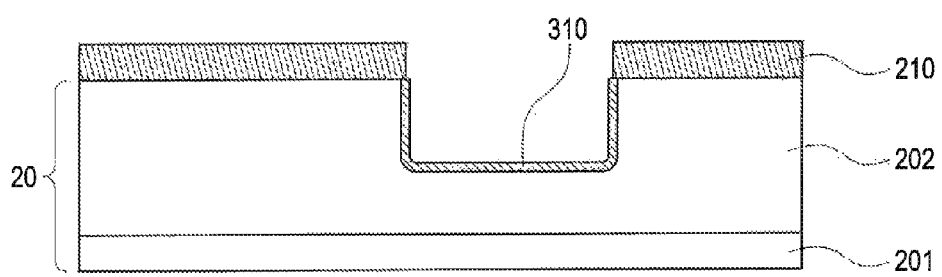
Figure 2G:
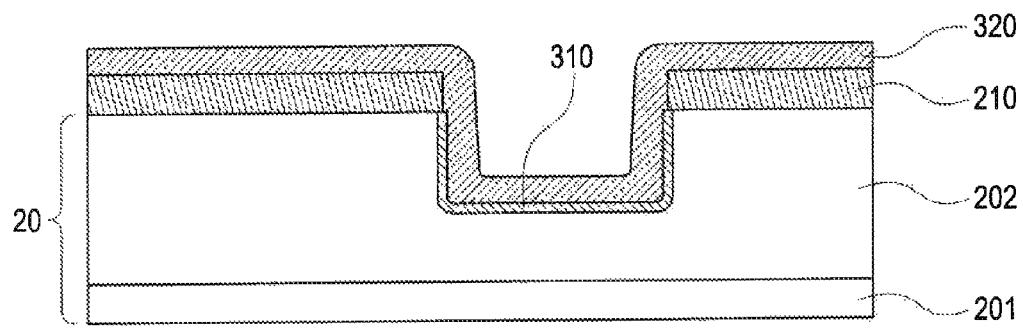
Figure 2H:
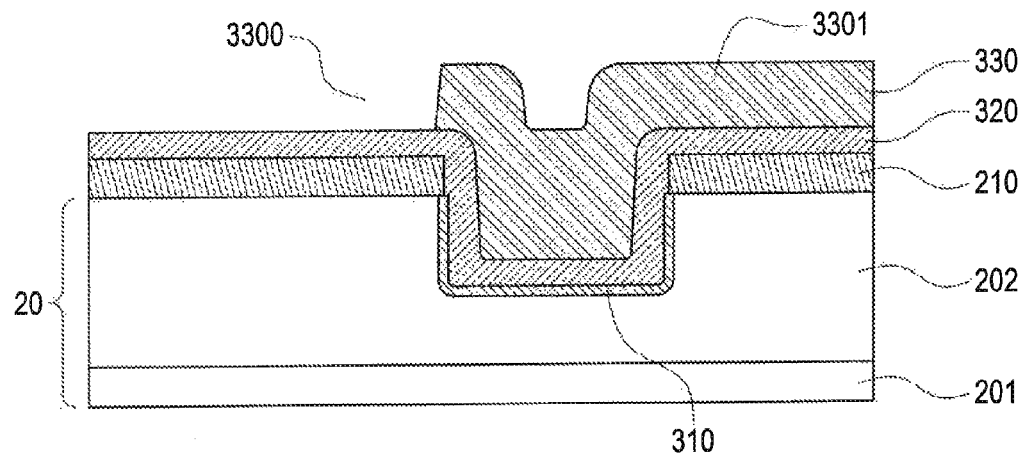
Figure 2I:
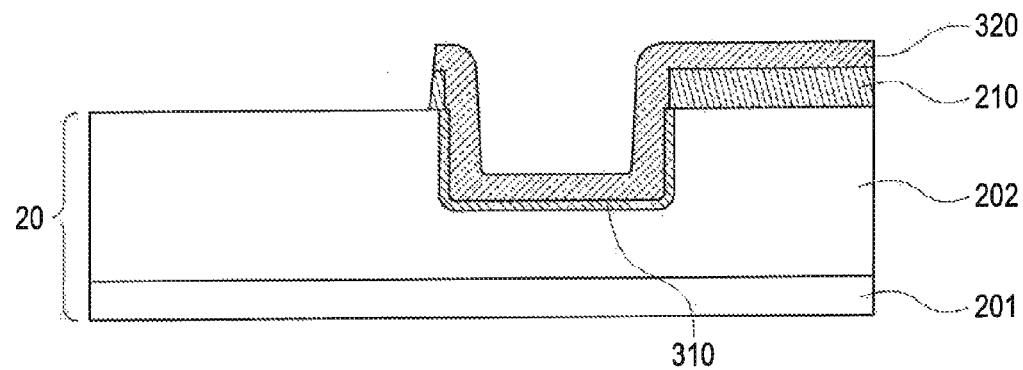
Figure 2J:
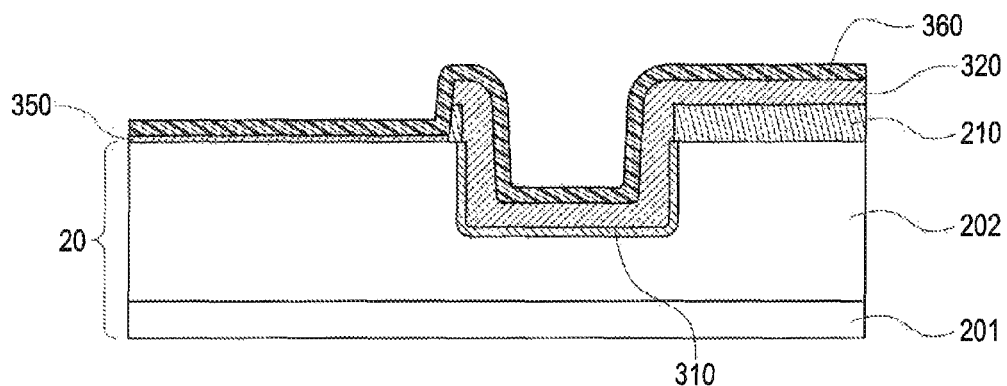
Figure 2K:
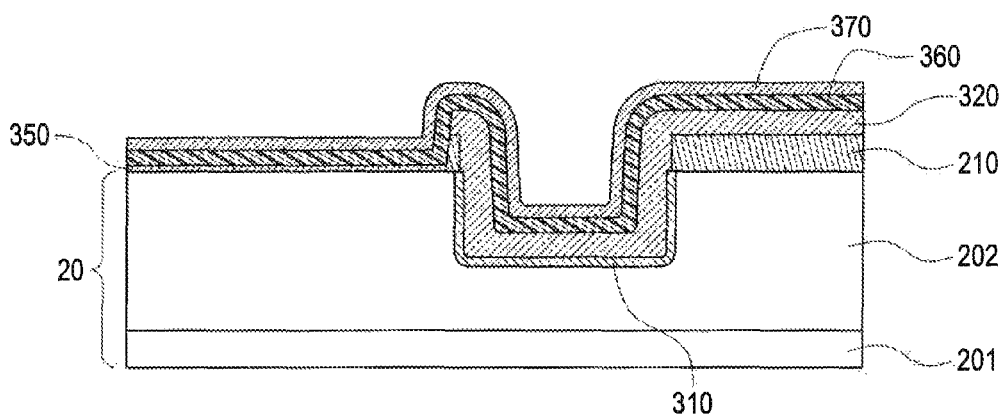
Figure 2L:
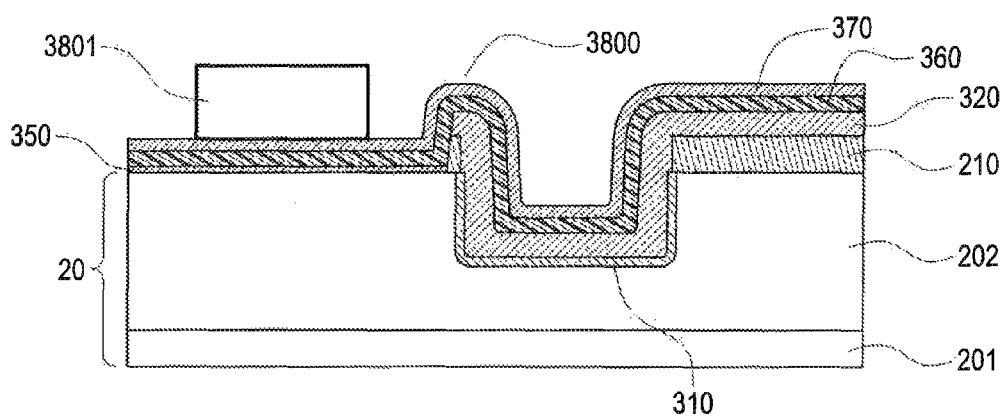
Figure 2M:
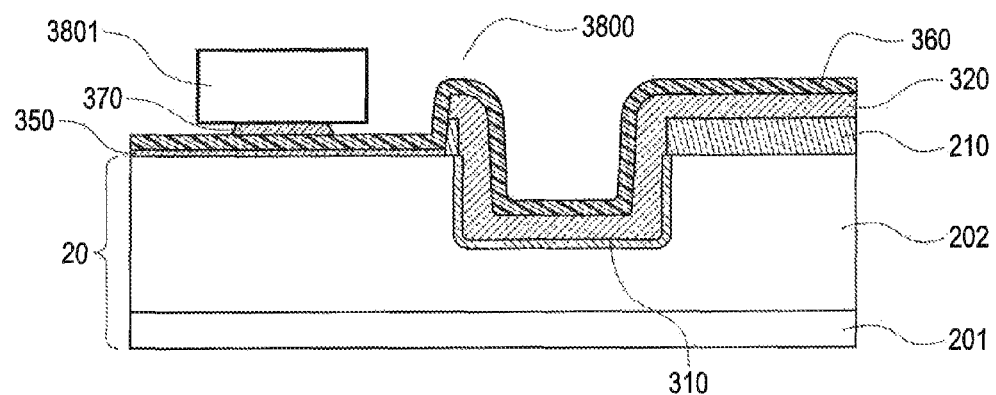
Figure 2N:
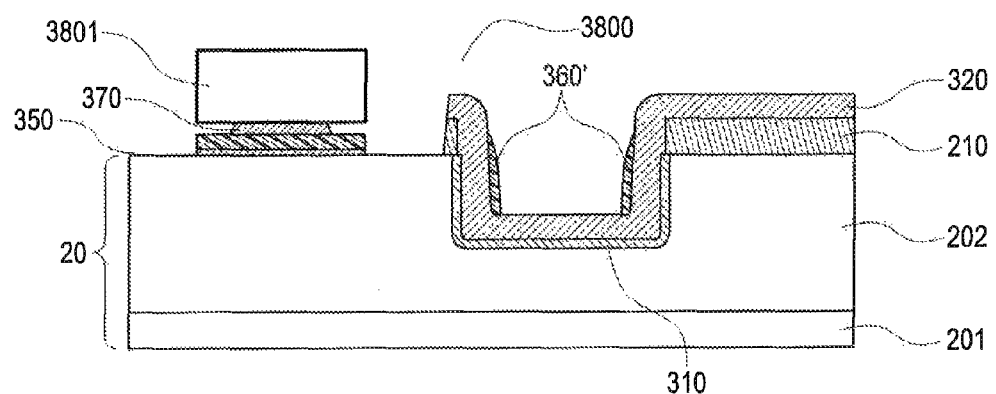
Figure 2O:
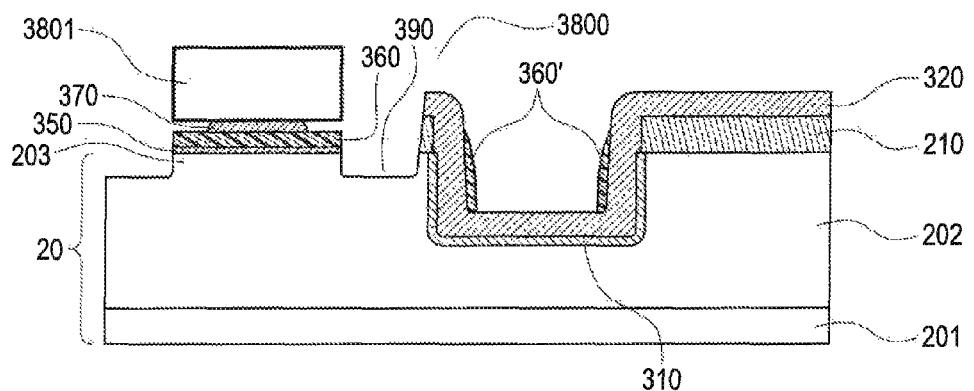
Figure 2P:
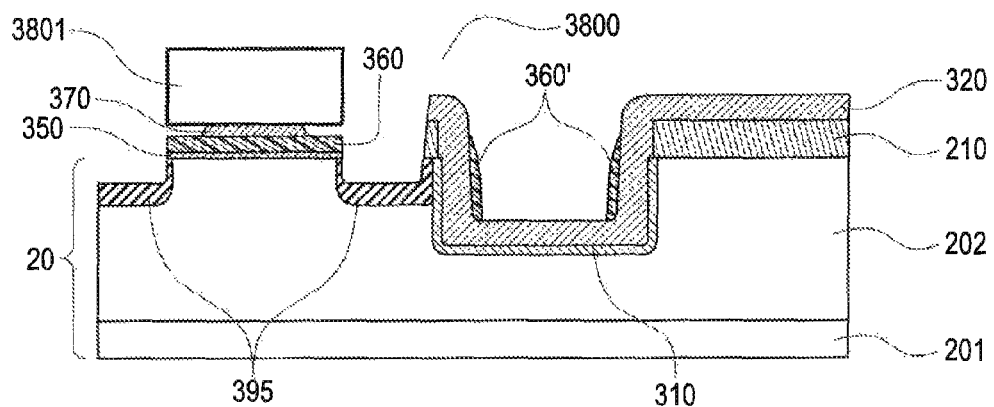
Figure 2Q:
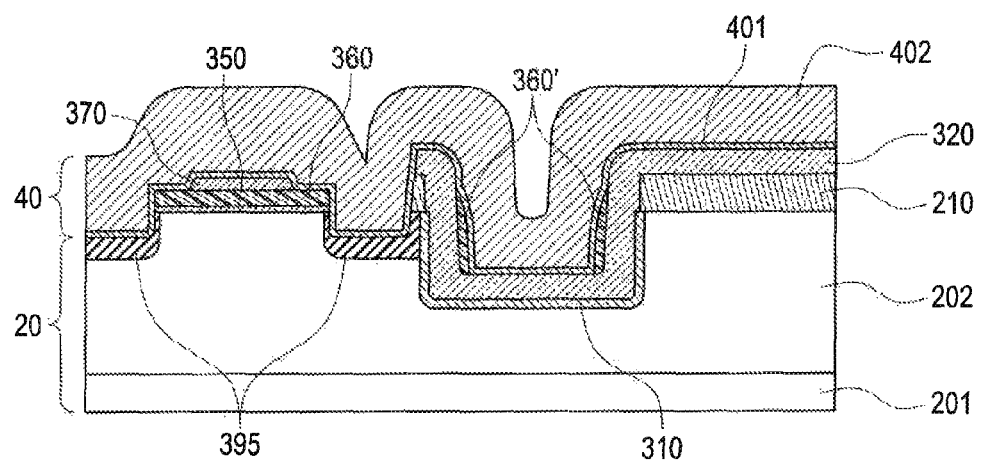
Figure 2R:
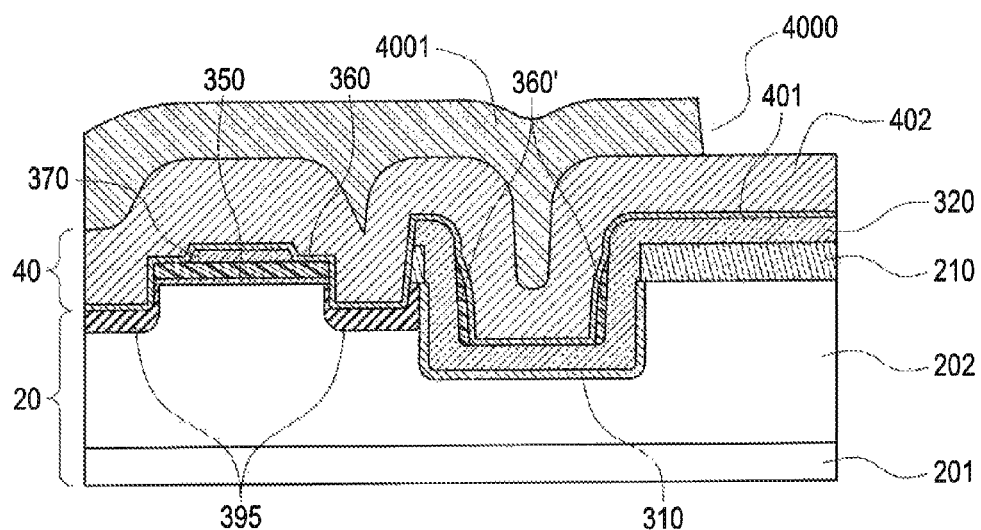
Figure 2S:
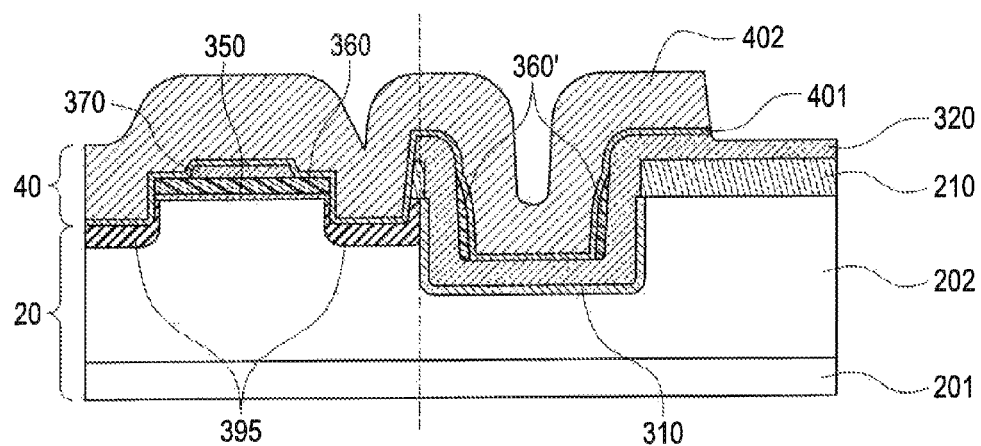

Please refer to FIGS. 2A~2S, which schematically illustrate a method of manufacturing a MOS diode with termination structure according to an embodiment of the present invention.

Firstly, as shown in FIG. 2A, a semiconductor substrate 20 with a heavily-doped N-type silicon layer 201 (N+ silicon layer) and a lightly-doped N-type epitaxial layer 202 (N-epitaxial layer) is provided. Even the lightly-doped N-type epitaxial layer 202 is shown to be thicker than the heavily-doped N-type silicon layer 201, it should be noted the drawing is only for demonstration and the lightly-doped N-type epitaxial layer 202 is actually thinner than the heavily-doped N-type silicon layer 201. Then, as shown in FIG. 2B, a first mask layer 210 (a field oxide layer, and can also be referred to as a field oxide layer structure in later description) is grown on the substrate 20 by thermal oxidation process. Then, a photoresist layer 211 is formed on the first mask layer 210 (FIG. 2C). A first photolithography process is performed to define a patterned photoresist zone 2111 and a photoresist-free zone 2110 on the photoresist layer 211 (FIG. 2D). An etching process is performed to remove a portion of the first mask layer 210, which is uncovered by the patterned photoresist zone 2111, such that a recess 30 is defined in the first mask layer 210. Moreover, the region left to the recess 30 is corresponding to the device region of the MOS diode, and the region right to the recess 30 is corresponding to the termination region of the MOS diode. However, above orientation is only for demonstrating the present invention and is not limitation for the present invention. As shown in FIG. 2E, the lightly-doped N-type epitaxial layer 202 is etched with the remaining first mask layer 210 as a mask to form a trench 31 in the lightly-doped N-type epitaxial layer 202 after the remaining patterned photoresist zone 2111 is removed. Afterward, a thermal oxide layer 310 is formed on the resulting structure. It should be noted that the thermal oxide layer 310 is only shown in the trench 31 because the thermal oxide layer 310 have much thinner thickness than that of the first mask layer 210. Afterward, a chemical vapor deposition (CVD) oxide layer 320 is formed on the resulting structure by CVD process and the CVD oxide layer 320 has relative thicker thickness than that of the thermal oxide layer 310 to cover the thermal oxide layer 310 as shown in FIG. 2G.

After the CVD oxide layer 320 is grown, a second photoresist layer (not shown) is formed on the resulting structure, and then a second photolithography process is performed to define a patterned photoresist zone 3301 and a photoresist-free zone 3300 on the second photoresist layer as shown in FIG. 2H, where the patterned photoresist zone 3301 covers the termination region including the trench 31 and exposes the other portion corresponding to the device region. Afterward, an etching step is performed to remove the first mask layer 210, the thermal oxide layer (not shown) and the CND oxide layer 320 on the photoresist-free zone 3300, and then the patterned photoresist zone 3301 is removed as shown in FIG. 2I.

As shown in FIG. 2J, a gate oxide layer 350 is formed by thermal oxidation process and a polysilicon layer 360 is then formed on the resulting structure, where the gate oxide layer 350 on the termination region is not particularly shown because the gate oxide layer 350 has relative thin thickness in comparison with the polysilicon layer 360. Afterward, a field oxide layer 370 functioning as a shielding oxide layer 370 is formed on the resulting structure and shields the polysilicon layer 360, as shown in FIG. 2K. The shielding oxide layer 370 has a thicker thickness than that of the gate oxide layer 350, and the thickness of the shielding oxide layer 370 is, but not limited to, 1000 angstrom. Afterward, a third photoresist layer (not shown) is formed on the resulting structure. A third photolithography process is performed to define a patterned photoresist zone 3801 and a photoresist-free zone 3800 on the third photoresist layer (FIG. 2L).

As shown in FIG. 2M, an isotropic wet etching step is performed with the patterned photoresist zone 3801 as a mask to remove the portion of the shielding oxide layer 370, which is not covered by the patterned photoresist zone 3801. Due to the isotropic nature of the isotropic wet etching step, undercuts (not labeled) are formed around the remaining shielding oxide layer 370 and below the patterned photoresist zone 3801. Afterward, dry etching step is performed to etch the polysilicon layer 360 and the gate oxide layer 350 on the resulting structure and sidewall polysilicon layer 360' is formed on the inner sidewall of the trench 31 as shown in FIG. 2N. Afterward, another dry etching step is performed on the resulting structure to further etch the lightly-doped N-type epitaxial layer 202, wherein the dry etching step only influences the lightly-doped N-type epitaxial layer 202 and does not affect the CVD oxide layer 320 on the termination region and the sidewall polysilicon layer 360' in the trench 31. By the another dry etching step, etched shallow trenches 390 are formed on the lightly-doped N-type epitaxial layer 202 and around the patterned photoresist zone 3801, as shown in FIG. 2O. Afterward, ion-implantation (such as boron ion) is performed to form P type semiconductor regions 395 on the lightly-doped N-type epitaxial layer 202 and below the etched shallow trenches 390, as shown in FIG. 2P. The portion of the lightly-doped N-type epitaxial layer 202 on the termination region is covered by the first mask layer 210 and the CND oxide layer 320, therefore, ion-implantation area will not form in the lightly-doped N-type epitaxial layer 202 of the region.

As shown in FIG. 2Q, after the formation of the P type semiconductor regions 395, the patterned photoresist zone 3801 is removed and a composite metal layer 40 is formed on the resulting structure. The composite metal layer 40 comprises a first metal layer 401 and a second metal layer 402, wherein the first metal layer 401 is made of titanium or titanium nitride, the second metal layer 402 is made of aluminum or other kind of metal. After the formation of the first metal layer 401, a rapid thermal nitridation (RTN) step is performed to substantially attach the first metal layer 401 to the underlying structure.

Afterward, a fourth photoresist layer (not shown) is formed on the resulting structure, and then a fourth photolithography process is performed to define a patterned photoresist zone 4001 and a photoresist-free zone 4000 on the fourth photoresist layer as shown in FIG. 2R, where the patterned photoresist zone 4001 covers the device region and portion of the termination region including at least the trench 31. A metal etching step is then performed with the patterned photoresist zone 4001 as a mask to remove the portion of the first metal layer 401 and the second metal layer 402 not covered by the patterned photoresist zone 4001. Then the patterned photoresist zone 4001 is removed as shown in FIG. 2S.

FIG. 2S also shows the sectional view of the MOS diode with termination structure according to the present invention. The MOS diode comprises a device region on the left side of the dashed line and a termination region on the right side of the dashed line. The device region mainly comprises a substrate (including the heavily-doped N-type silicon layer 201 and the lightly-doped N-type epitaxial layer 202, wherein the lightly-doped N-type epitaxial layer 202 comprises a plurality of mesas 203, and FIG. 2O shows the example with one mesa), a P-type semiconductor region 395 arranged around the mesa 203, at least one gate oxide layer 350 arranged on the mesa 203, at least one polysilicon layer 360 arranged on the gate oxide layer 350, at least one shielding oxide layer 370 arranged on the polysilicon layer 360 and covering only partial top face of the polysilicon layer 360, a metal layer 40 including a first metal layer 401 and a second metal layer 402 and arranged on the P-type semiconductor region 395, the portion of the polysilicon layer 360 not covered by the shielding oxide layer 370, and the shielding oxide layer 370. The metal layer 40 is electrically connected to source (not shown) and gate (not shown) of the MOS device to provide anode for the MOS diode, and corresponding cathode (not shown) is formed on the substrate 20.

Moreover, the termination region on the right side of FIG. 2S mainly comprise the substrate (also including the heavily-doped N-type silicon layer 201 and the lightly-doped N-type epitaxial layer 202), a trench formed in the lightly-doped N-type epitaxial layer 202 (not labeled in FIG. 2S, it can be referred to element 31 shown in FIG. 2E), a field oxide layer structure 210 arranged outside the trench, CVD oxide layer 320 formed in the trench and on the field oxide layer structure 210, a sidewall polysilicon layer 360' arranged on the oxide layer formed on the sidewall of the trench, and the metal layer 40 including the first metal layer 401 and the second metal layer 402 and arranged on the CVD oxide layer 320 in the trench, the sidewall polysilicon layer 360' and the CVD oxide layer 320 outside the trench. The termination region with the trench can evenly spread electric field when a reverse bias is applied to the MOS diode, thus enhancing the reverse voltage tolerance of the MOS diode.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A metal oxide semiconductor (MOS) diode with termination structure comprising:
    a substrate having at least a first conductive-type epitaxial layer and a plurality of mesas formed on the first conductive-type epitaxial layer;
    a plurality of etched shallow trenches surrounding the mesas;
    a plurality of second conductive-type semiconductor regions arranged in the etched shallow trenches;
    a plurality of gate oxide layers arranged on corresponding mesas;
    a plurality of polysilicon layers arranged on corresponding gate oxide layers;
    a plurality of shielding oxide layers arranged on corresponding polysilicon layers and covering at least partial surface of the polysilicon layers, a thickness of the shielding oxide layers being thicker than a thickness of the gate oxide layer;
    a termination structure comprising:
    a trench formed on the first conductive-type epitaxial layer;
    an oxide layer arranged at least in the trench;
    a sidewall polysilicon layer arranged on the oxide layer within the trench; and
    a metal layer covering the second conductive-type semiconductor regions, the polysilicon layers, the shielding oxide layers, the oxide layer in the trench and the sidewall polysilicon layer in the trench.

2. The MOS diode in claim 1, wherein the first conductive-type is N type and the second conductive-type is P type.

3. The MOS diode in claim 1, wherein the metal layer comprises a first metal layer and a second metal layer.

4. The MOS diode in claim 3, wherein the first metal layer is titanium or titanium nitride.

5. The MOS diode in claim 4, wherein the first metal layer is subjected to a rapid thermal nitridation after the first metal layer is formed.

6. The MOS diode in claim 3, wherein the second metal layer is aluminum.

7. The MOS diode in claim 1, further comprising a field oxide layer structure on the first conductive-type epitaxial layer and outside the trench.

8. A method for manufacturing a metal oxide semiconductor (MOS) diode with termination structure comprising:
    (a) providing a substrate having at least a first conductive-type epitaxial layer, the first conductive-type epitaxial layer having a trench, the MOS diode having a device region on one side of the trench and a termination region on another side of the trench, the trench having an oxide layer therein;
(b) forming a gate oxide layer, a polysilicon layer and a shielding oxide layer sequentially on the first conductive-type epitaxial layer;
(c) forming a plurality of mesas on the device region, forming etched shallow trenches surrounding the mesas, and forming sidewall polysilicon layer on the oxide layer within the trench;
(d) ion-implanting the etched shallow trenches to form plurality of second conductive-type semiconductor regions arranged in the etched shallow trenches; and
(e) forming a metal layer on the device region and on the trench.

9. The method in claim 8, herein the step c further comprises:
(c1) forming a patterned photoresist layer and isotropic etching the shielding oxide layer with the patterned photoresist layer as mask to remove a portion of the shielding oxide layer not covered by the patterned photoresist layer.

10. The method in claim 9, further comprising a step after the step c1:
(c2) anisotropic etching the polysilicon layer and the gate oxide layer with the patterned photoresist layer as mask to remove a portion of the polysilicon layer and the gate oxide layer not covered by the patterned photoresist layer.

11. The method in claim 10, further comprising a step after the step c2:
(c3) anisotropic etching the first conductive-type epitaxial layer with the patterned photoresist layer as mask to form the etched shallow trenches on the first conductive-type epitaxial layer.

12. The method in claim 8, wherein the first conductive-type is N type and the second first conductive-type is P type.

13. The method in claim 8, wherein the metal layer comprises a first metal layer and a second metal layer.

14. The method in claim 13, wherein the first metal layer is titanium or titanium nitride, and the second metal layer is aluminum.

15. The method in claim 14, the first metal layer is subjected to a rapid thermal nitridation after the first metal layer is formed.

16. The method in claim 8, wherein the shielding oxide layer is thicker than the oxide layer.

* * * * *